United States Patent [19]
Boyle

[11] Patent Number: 6,159,056
[45] Date of Patent: Dec. 12, 2000

[54] ELECTRICAL CONTACT ASSEMBLY FOR INTERCONNECTING TEST APPARATUS AND THE LIKE

[75] Inventor: Stephen A. Boyle, Attleboro, Mass.

[73] Assignee: Rika Electronics International, Inc., Attleboro, Mass.

[21] Appl. No.: 09/440,799

[22] Filed: Nov. 15, 1999

Related U.S. Application Data

[60] Provisional application No. 60/110,026, Nov. 25, 1998.

[51] Int. Cl.[7] .................................................. H01R 13/24
[52] U.S. Cl. ........................................................... 439/700
[58] Field of Search .................................... 439/700, 482, 439/824; 324/761

[56] References Cited

U.S. PATENT DOCUMENTS

| | | | |
|---|---|---|---|
| 3,416,125 | 12/1968 | Theve | 439/700 |
| 4,636,026 | 1/1987 | Cooney et al. | 439/482 |
| 5,227,718 | 7/1993 | Stowers et al. | 324/158 |
| 5,330,448 | 7/1994 | Chu | 604/280 |

Primary Examiner—Neil Abrams
Assistant Examiner—Hae Moon Hyeon
Attorney, Agent, or Firm—John A. Haug

[57] ABSTRACT

An electrical contact assembly (10) for use, for example, in interfacing between a circuit board or the like to be tested and test apparatus has first and second contact plungers (14,16) which are slidably mounted in an outer barrel (12) with respective contact projections (14c,16c) extending out opposite ends of the barrel. The first contact plunger (14) is hollow and slidably receives therein an elongated longitudinally extending portion (16a) of the second contact plunger (16), the contact plungers being biased apart by a coil spring (18) mounted between respective spring seats (14e,16g) of the contact plungers. Alternate embodiments (10',10") include a plurality of longitudinally extending fingers (14h,16h) formed in one of the plungers which form an interference fit with the other plunger. In another embodiment (10''') the first and second contact plungers (14",16") are interlocked together by means of a decreased diameter portion (14k) in the bore of the first contact plunger and a cooperating enlarged diameter portion (16m) at the distal end of the elongated portion (16a).

7 Claims, 2 Drawing Sheets

ELECTRICAL CONTACT ASSEMBLY FOR INTERCONNECTING TEST APPARATUS AND THE LIKE

RELATED APPLICATIONS

Priority is claimed based on Provisional Application Ser. No. 60/110,026, filed Nov. 25, 1998.

FIELD OF THE INVENTION

This invention relates generally to electrical contact systems and more particularly to spring biased contacts used, for example, to interconnect test apparatus, analyzers and the like to circuit boards and the like to be tested.

BACKGROUND OF THE INVENTION

Electrical contact systems having spring loaded, movable contacts are employed in circuit board and electronic circuit test systems and the like in which electrical contact is made between a circuit or device and one or more test points. The electrical contact system generally comprises a metal barrel having a contact plunger telescopically slidable therein and a spring disposed within the barrel for biasing the contact plunger to a normally outward position. The contact plunger has an outer end provided with a probe tip of a selected configuration to engage a test pad or the like of a circuit board or other device. As test systems employ higher radio frequencies in testing procedures there is an increasing need to provide the shortest possible so-called electrical path in a matched impedance system. Conventional probe systems include a helical coil spring surrounding the plunger and disposed within the barrel which result in a longer than desirable electrical path. Another approach disclosed in U.S. Pat. No. 4,636,026 employs a plunger disposed within a metal sleeve having an inner end provided with angled ramp surfaces which cooperate with laterally deflectable spring fingers which serve to bias the plunger to a normally outward position.

While this device can result in a relatively short electrical path it is limited in that it has a travel range limited by the angled ramp and cannot operate over a wide range. It is further limited with regard to the diameter of the sleeve which can be used in making the device. Extended travel requires an increase in diameter of the device which in turn has an adverse effect on pitch between adjacent devices. Yet another disadvantage is that the variable geometry resulting from the changing diameter of the electrical contact on the angled ramp is inconsistent with a matched impedance system.

SUMMARY OF THE INVENTION

It is an object of the present invention to provide electrical contact apparatus for interconnecting test apparatus and the like with contact pads of a circuit board or other electrical device to be tested with a device having positive contact pressure which provides an improved short and direct electrical path. Another object of the invention is the provision of a system which operates under a wide range of conditions. Yet another object is the provision of an electrical contact apparatus which permits improved fine pitch for use of a plurality of such apparatuses. Another object of the invention is the provision of such apparatus which is reliable, low cost.

Briefly stated, an electrical contact system made in accordance with a first embodiment of the invention comprises first and second generally cylindrical electrical contact plungers in which the first plunger is tubular having a bore which slidingly receives therein an elongated portion of the second electrical contact plunger. A helical coil spring is received on the second contact plunger between one spring seat and another spring seat formed by the inner end face of the first contact plunger so that both contact plungers are biased toward a normally outward position. A primary electrical current path is established by means of the spring causing skewed movement of the elongated portion of the distal end of the second contact plunger into engagement with the first contact plunger and a redundant, secondary electrical current path at the corresponding opposite portions of the electrical contact plungers through a tubular outer barrel. In a modified embodiment a portion of the first electrical contact plunger is formed into longitudinally extending fingers formed on its inner end which are formed to extend radially inwardly a slight amount to form, in effect, an interference fit with the second electrical contact plunger thereby providing a positive electrical engagement between the contact plungers. In another modified embodiment, the inner end of the second electrical contact plunger is bifurcated and spread apart with an effective outer diameter slightly greater than the bore of the first electrical contact plunger thereby providing positive electrical engagement between the plungers. In another modified embodiment the two electrical contact plungers are provided with interlocking collar and recess portions so that the electrical contact system can be used without the metal barrel to hold the parts together and can be more easily assembled using mass assembly techniques.

BRIEF DESCRIPTION OF THE DRAWINGS

Other objects, advantages and details of the novel and improved contact assembly of the invention appear in the following detailed description of preferred embodiments of the invention, the detailed description referring to the drawings in which.

DESCRIPTION OF PREFERRED EMBODIMENTS

Figure 1:
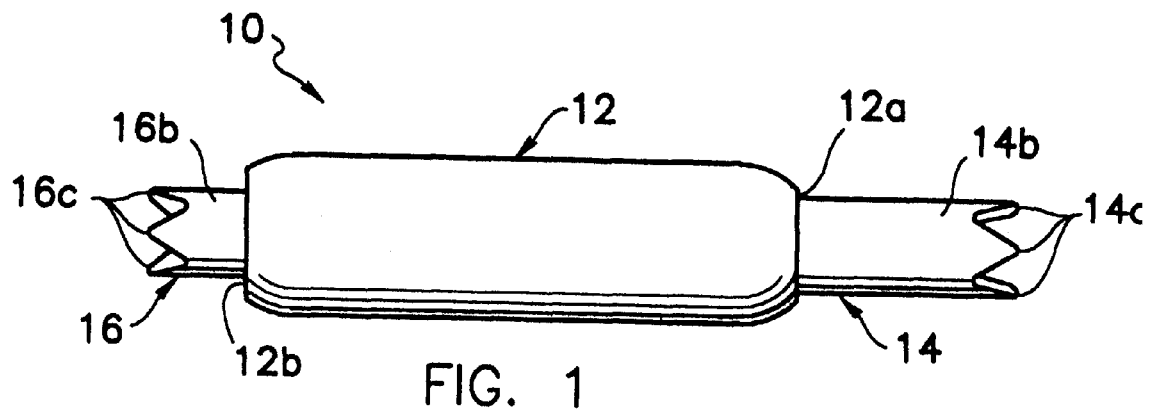
FIG. 1 is a front elevational view of an electrical contact system made in accordance with a first embodiment of the invention.
Figure 2:
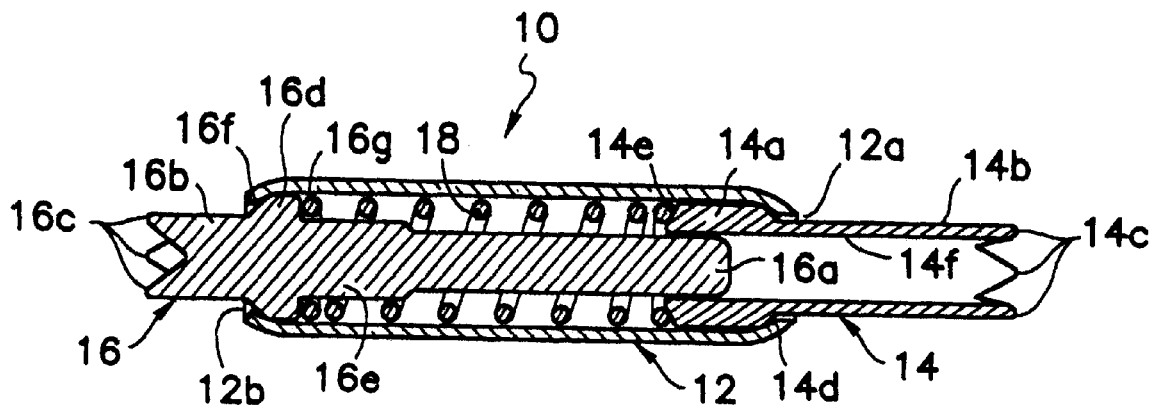
FIG. 2 is a longitudinal cross section taken through the FIG. 1 structure when in the normal, at rest position.
Figure 3:
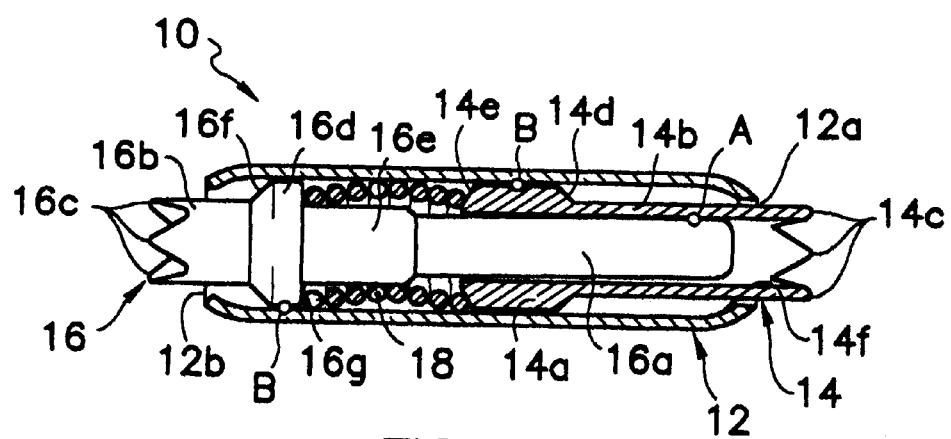
FIG. 3 is a view similar to FIG. 2 but shown in a position with the electrical contact plungers depressed inwardly.

With reference to FIGS. 1–3 an electrical contact system assembly 10 made in accordance with a first embodiment of the invention is shown which comprises a generally cylindrical, open ended, tubular barrel 12 formed of suitable electrically conductive material, such as gold plated nickel silver, with first and second axially movable electrical contact plungers 14,16 disposed within barrel 12 and extending outwardly from opposite ends 12a,12b of the barrel. The openings formed at ends 12a,12b have a reduced diameter, as by rolling the ends of the barrel radially inwardly in order to retain the contact plungers within the barrel as will be discussed below. Contact plungers 14,16 are made of any suitable electrically conductive material such as gold plated beryllium copper. Contact plunger 14 is configured in a generally cylindrical, tubular, open ended, configuration having axially extending portion 14a formed with an outer diameter slightly less than the inside diameter of barrel 12 for sliding reception within the barrel and a second axially extending, portion 14b formed with a reduced outer diameter selected to be less than the open end 12a of barrel 12. The outer end of contact plunger 14 is formed with a selected contact engagement configuration such as axially extending projections 14c, shown in the drawings. First portion 14a is formed with a tapered transition surface 14d which cooperates with the rolled over barrel end 12a to retain first portion 14a of contact plunger 14 within the barrel by limiting outward movement of the contact plunger. The inner end of contact plunger 14 is formed with a tapered surface 14e and serves as a spring seat for a coil spring 18 to be discussed.

Second contact plunger 16 is formed into a generally cylindrical, solid configuration and has a first elongated, axially extending portion 16a formed with a diameter selected to be slidingly received within the bore 14f of first contact plunger 14, a second axially extending portion 16b having a diameter, such as the same as diameter as that of portion 14b, selected to be received through rolled over end 12b of barrel 12, and having a suitable contact engagement configuration such as axially extending projections 16c. Contact plunger 16 is also formed with intermediate, axially extending portions 16d,16e, with portion 16d having an outer diameter selected to be slidingly received within the bore of barrel 12, preferably the same as the outer diameter of portion 14a of contact plunger 14. A tapered interface surface 16f is formed between axially extending portions 16b and 16d which serves the same function as that of tapered surface 14d of contact plunger 14, i.e., to cooperate with the rolled over end 12b of barrel 12 to limit outward motion of second contact plunger 16. The inner opposite end of axially extending portion 16d is formed with a spring receiving seat 16g which is shown to be perpendicular to the longitudinal axis of the cylindrical contact plunger 16 but could, if desired, be formed with a taper similar to that of seat 14e. Axially extending portion 16e is formed with any desired diameter less than the inside diameter of coil spring 18 and preferably greater than the diameter of axial portion 16a. Coil spring 18, formed of suitable spring wire such as stainless steel, extends between surfaces 14e and 16g of respective contact plungers 14 and 16, and biases the plungers apart toward the at rest FIG. 2 position. During use as a contact interface, the plungers are forced inwardly against the bias of spring 18 providing a selected level of positive contact pressure. By locating the coil spring between the contact plungers and with one of the contact plungers received within the other contact plunger, a maximum diameter spring coil can be utilized for a given diameter probe to maximize flexibility of spring design while minimizing the number of coils to the spring and the overall length of the probe and electrical path.

As spring 18 is depressed it buckles and causes a skewed relationship between contact plungers 14,16 with a principal electrical current path established from contact projections 14c to a point between the inside surface defining bore 14f and the elongated portion 16a of contact plunger 16 shown at A in FIG. 3 and from there to contact projections 16c. The current passes through the outer surface (skin affect) of the contact plungers in a high speed. Points B in FIG. 3 show the corresponding and opposite electrical current pattern through the gold plating on the inside surface of barrel 12 and the gold plating on the outside surface of contact plungers 14,16 to form a secondary, redundant contact system. If desired, a third contact system can be provided when a measure of bulk resistance is the primary concern rather than signal speed. In a three contact system the spring could be made of gold plated beryllium copper, or the like, to enhance its electrical conductivity. For a two contact system particularly adapted for high performance applications, coil spring 18 would be selected so that it is not highly electrically conductive, as by using stainless steel with a suitable passivating coating to minimize signal conduction by the spring and consequently minimize the creation of noise and induction.

By way of example, the physical length of a contact assembly made in accordance with FIGS. 1–3 is approximately 0.200 inches long with a barrel 12 having an outer diameter of approximately 0.030 inches.

Figure 4:
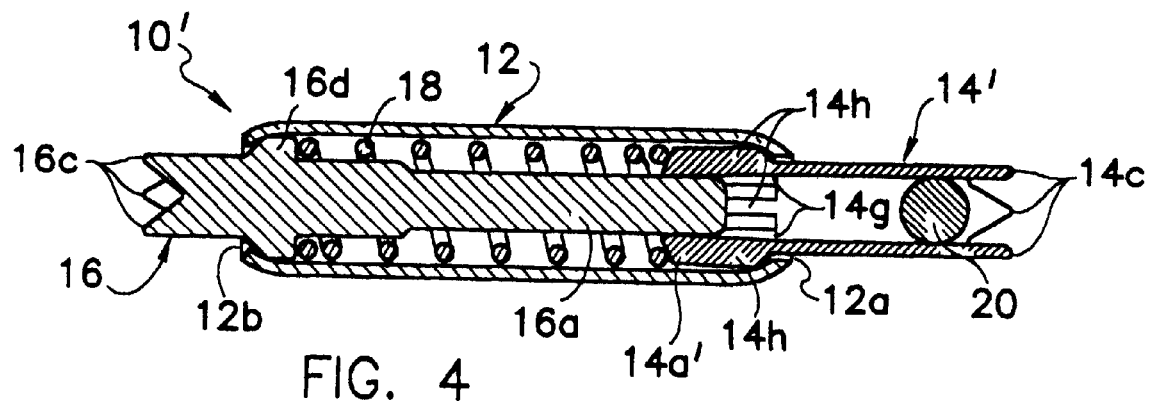
FIG. 4 is a cross section similar to FIG. 2, of a modified embodiment of the invention.
Figure 6:
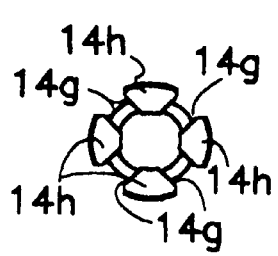
FIG. 6 is a left end view of the FIG. 5 electrical contact plunger.
Figure 5:
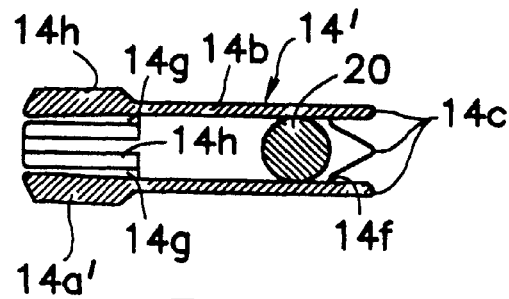
FIG. 5 is a longitudinal cross sectional view of an electrical contact plunger used in the FIG. 4 embodiment.

With reference to FIGS. 4–6 an alternate embodiment 10' is shown comprising a modified contact plunger 14' in which a plurality of axially extending slots 14g are formed in axially extending portion 14a, forming a plurality of axially extending fingers 14h. Fingers 14h are formed to extend slightly radially inwardly so that when elongated portion 16a is forced into the opening formed by the fingers, in effect causing an interference fit, a positive electrical contact pressure is provided even when in the at rest, extended position. As shown, four fingers 14h are provided however it will be realized that the particular number of fingers is a matter of choice. The provision of the radially inwardly extending fingers insures an optimum, direct as well as redundant signal path.

Also shown in FIGS. 4–6 is a seal ball 20 which, if desired, may be placed in the bore of contact plunger 14' to prevent ingress of contaminants which could otherwise adversely effect electrical engagement between the contact plungers. The diameter of seal ball 20 is selected to form an interference fit and is pressed into the bore adjacent to contact engagement projections 14c.

Figure 7:
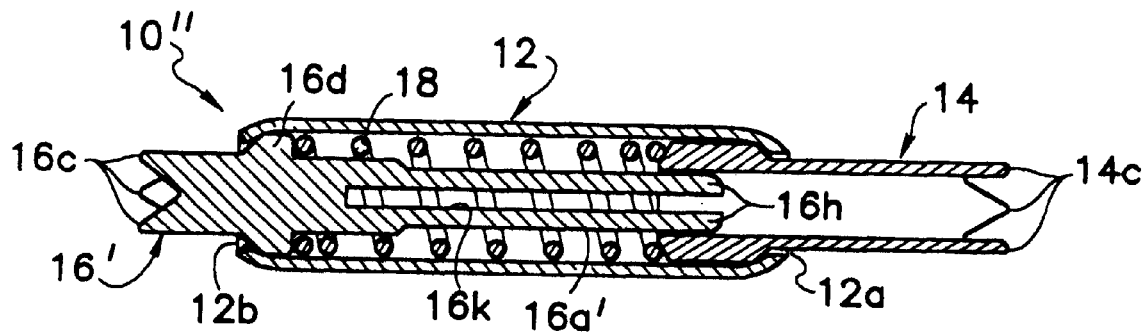
FIGS. 7 and 8 are views similar to FIG. 4 of two respective modified embodiments of the invention.

FIG. 7 shows a modification 10" of FIGS. 4–6 embodiment in which contact plunger 16' is formed with two or more axially extending fingers 16h by means of axially extending slot 16k for use with the unslotted contact plunger 14 as shown previously in FIGS. 1–3. In the FIG. 7 embodiment fingers 16h would be formed to extend slightly radially outwardly to provide the desired contact pressure when inserted in the bore of contact plunger 14. The FIG. 7 embodiment provides somewhat simplified machining from a solid member as well as providing longer fingers with greater flexibility for controlling contact pressure between the fingers and contact plunger 14. It will be understood that seal ball 20 can be used, if desired, in the FIG. 7 embodiment as well as in the FIGS. 1–3 embodiment although not shown in those figures.

Figure 8:
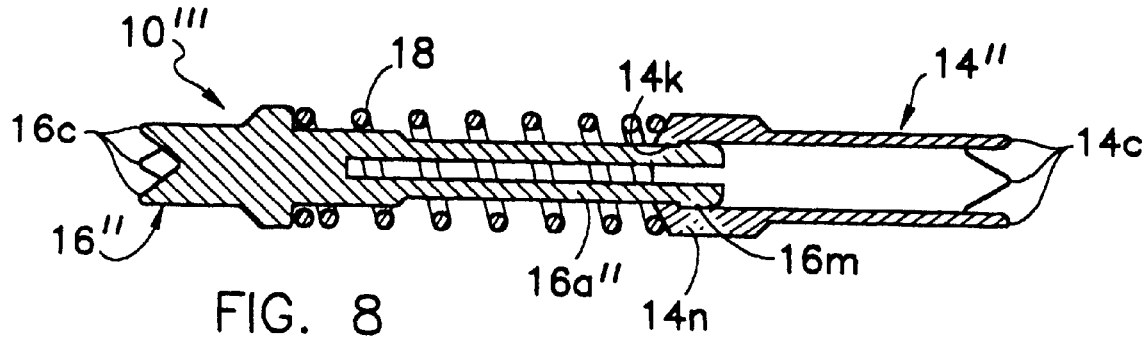

FIG. 8 shows a modified contact assembly 10''' in which the two contact plungers are interlocked together without using outer barrel 12 which is particularly amenable to mass production techniques, as by assembling by vibrating the parts together. As shown, contact plunger 14" is similar to contact plunger 14 of FIGS. 1–4 and 7 but is provided with a decreased diameter bore 14k at the inner end of the plunger, i.e., the end opposite to contact engagement projections 14c to form an annular flange 14n. Axially extending portion 16a" of contact plunger 16" is provided with an enlarged diameter portion 16m forming a split collar which is adapted to interfit with the annular flange 14n to lock the contact plungers together as well as providing a primary current path. As in the above embodiments, another current path could be provided by plating spring 18 with precious metal, such as gold. The FIG. 8 embodiment can be used for a lower cost assembly in applications in which radio frequency high performance is less important and where it is desired to minimize pitch between contact assemblies in a system having a plurality of densely disposed contact assemblies.

Electrical contact assemblies made in accordance with FIGS. 1–8, as described above, provide an improved shortened electrical current path with positive biasing and contact pressure useful under a wide range of conditions and with a finer pitch than conventional devices. The contact assemblies of FIGS. 1–7 are particularly useful in providing a matched impedance radio frequency design in which the outer barrel 12 serves to create a uniform electrical resistance characteristic.

It will be understood that the invention includes all modifications and equivalents of the described embodiments falling within the scope of the appended claims.

What is claimed:

1. An electrical contact assembly comprising generally cylindrical first and second electrical contact plungers each having inner and outer ends and having a selected electrical contact configuration at the outer end thereof, the first electrical contact plunger having a longitudinally extending bore formed at least in the inner end, the second electrical contact plunger having an elongated cylindrical portion slidingly received in the bore of the first electrical contact plunger, the inner end of one of the first and second electrical contact plungers being formed with at least two longitudinally extending fingers which are biased into sliding engagement with the other electrical contact plunger, a coil spring extending between the first and second electrical contact plungers biasing the electrical contact plungers apart, and means to limit outer movement of the first and second electrical contact plungers.

2. An electrical contact assembly according to claim 1 further comprising an open ended, tubular barrel formed of electrically conductive material in which the first and second electrical contact plungers are movably mounted with the outer end of each electrical plunger extending through a respective open end of the barrel.

3. An electric contact assembly according to claim 2 in which the means to limit movement between the electrical contact plungers comprises inwardly extending portions of the barrel at the open ends thereof which interact with a respective portion of each contact plunger.

4. An electrical contact assembly according to claim 1 in which the means to limit movement between the electrical contact plungers includes a radially, outwardly extending collar at the distal end of the elongated cylindrical portion of the second electrical contact plunger and a flange extending radially inwardly from the surface defining the bore in the first electrical contact plunger which interfits with the collar thereby limiting longitudinal movement of the electrical contact plungers relative to one another.

5. An electrical contact assembly according to claim 1 in which the inner end of the first electrical contact plunger is formed with the longitudinally extending fingers which are biased into sliding engagement with the second electrical contact plunger.

6. An electrical contact assembly according to claim 2 in which a radially, outwardly extending flange is formed on the second electrical contact plunger to serve as a spring seat for the coil spring and the inner end of the first electrical contact plunger has a face surface which forms another spring seat for coil spring.

7. An electric contact assembly according to claim 1 in which the bore extends completely through the first electrical contact plunger from the inner to the outer end and a sealing ball is press fit into the outer end to prevent ingress of contaminants.

\* \* \* \* \*